(12) United States Patent
Gruen

(10) Patent No.: US 7,572,332 B2
(45) Date of Patent: Aug. 11, 2009

(54) SELF-COMPOSITE COMPRISED OF NANOCRYSTALLINE DIAMOND AND A NON-DIAMOND COMPONENT USEFUL FOR THERMOELECTRIC APPLICATIONS

(75) Inventor: Dieter M. Gruen, Downers Grove, IL (US)

(73) Assignee: Dimerond Technologies, LLC, Downers Grove, IL (US)

( * ) Notice: Subject to any disclaimer, the term of this patent is extended or adjusted under 35 U.S.C. 154(b) by 547 days.

(21) Appl. No.: 11/380,283

(22) Filed: Apr. 26, 2006

(65) Prior Publication Data

US 2007/0082200 A1     Apr. 12, 2007

Related U.S. Application Data

(60) Provisional application No. 60/725,541, filed on Oct. 11, 2005.

(51) Int. Cl.
   *C30B 23/00* (2006.01)
   *C30B 28/12* (2006.01)

(52) U.S. Cl. ............... 117/87; 117/4; 117/929; 117/951; 977/712

(58) Field of Classification Search ............ 977/712; 117/4, 87, 929, 951
   See application file for complete search history.

(56) References Cited

U.S. PATENT DOCUMENTS

| | | | | |
|---|---|---|---|---|
| 5,209,916 A * | 5/1993 | Gruen | ............... | 423/446 |
| 5,273,788 A * | 12/1993 | Yu | ............... | 427/554 |
| 5,328,676 A * | 7/1994 | Gruen | ............... | 423/446 |
| 5,698,328 A * | 12/1997 | Bunshah et al. | ............... | 428/408 |
| 5,772,760 A * | 6/1998 | Gruen et al. | ............... | 117/104 |
| 6,020,677 A * | 2/2000 | Blanchet-Fincher et al. | ............... | 313/336 |
| 6,592,839 B2 * | 7/2003 | Gruen et al. | ............... | 423/446 |
| 6,791,108 B1 * | 9/2004 | Olivas | ............... | 257/30 |
| 7,127,286 B2 * | 10/2006 | Mech et al. | ............... | 607/2 |
| 7,309,446 B1 * | 12/2007 | Kley | ............... | 216/11 |
| 7,309,476 B2 * | 12/2007 | Carlson et al. | ............... | 423/446 |
| 7,312,562 B2 * | 12/2007 | Dahl et al. | ............... | 313/311 |
| 2003/0152700 A1 * | 8/2003 | Asmussen et al. | ............... | 427/249.8 |
| 2004/0016397 A1 * | 1/2004 | Carlson et al. | ............... | 117/84 |
| 2004/0198048 A1 * | 10/2004 | Dahl et al. | ............... | 438/689 |
| 2004/0198049 A1 * | 10/2004 | Dahl et al. | ............... | 438/689 |
| 2004/0221796 A1 * | 11/2004 | Swain et al. | ............... | 117/84 |
| 2004/0227138 A1 * | 11/2004 | Dahl et al. | ............... | 257/77 |
| 2004/0247515 A1 * | 12/2004 | Gardner | ............... | 423/447.2 |
| 2004/0251478 A1 * | 12/2004 | Dahl et al. | ............... | 257/232 |
| 2005/0008560 A1 * | 1/2005 | Kataoka et al. | ............... | 423/445 R |
| 2005/0019114 A1 * | 1/2005 | Sung | ............... | 407/119 |
| 2005/0168122 A1 * | 8/2005 | Dahl et al. | ............... | 313/311 |
| 2005/0200260 A1 * | 9/2005 | Swain et al. | ............... | 313/311 |
| 2006/0121279 A1 * | 6/2006 | Petrik | ............... | 428/403 |
| 2006/0222850 A1 * | 10/2006 | Xiao et al. | ............... | 428/408 |
| 2007/0082200 A1 * | 4/2007 | Gruen | ............... | 428/408 |
| 2007/0126312 A1 * | 6/2007 | Sung | ............... | 310/306 |

(Continued)

*Primary Examiner*—Robert M Kunemund
*Assistant Examiner*—G. Nagesh Rao
(74) *Attorney, Agent, or Firm*—Fitch Even Tabin & Flannery

(57) ABSTRACT

One provides nanocrystalline diamond material that comprises a plurality of substantially ordered diamond crystallites that are sized no larger than about 10 nanometers. One then disposes a non-diamond component within the nanocrystalline diamond material. By one approach this non-diamond component comprises an electrical conductor that is formed at the grain boundaries that separate the diamond crystallites from one another. The resultant nanowire is then able to exhibit a desired increase with respect to its ability to conduct electricity while also preserving the thermal conductivity behavior of the nanocrystalline diamond material.

10 Claims, 2 Drawing Sheets

U.S. PATENT DOCUMENTS

2007/0137684 A1* 6/2007 Gruen .................... 136/201
2007/0187153 A1* 8/2007 Bertagnolli ................ 175/374
2008/0226840 A1* 9/2008 Asmussen et al. ........... 427/575
2009/0004092 A1* 1/2009 Dolmatov ................... 423/446
2009/0017258 A1* 1/2009 Carlisle et al. ............. 428/143
2009/0042029 A1* 2/2009 Havel et al. ................. 428/372

* cited by examiner

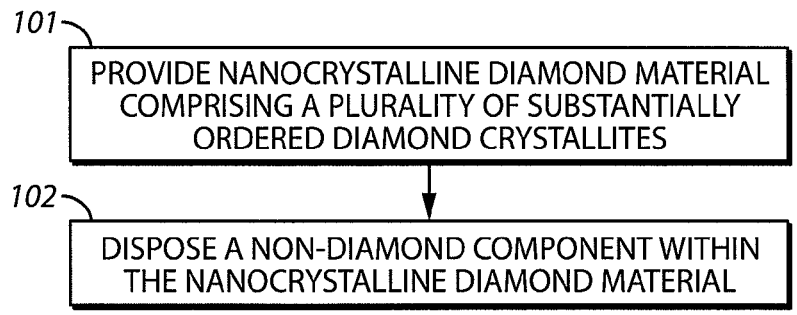
FIG. 1
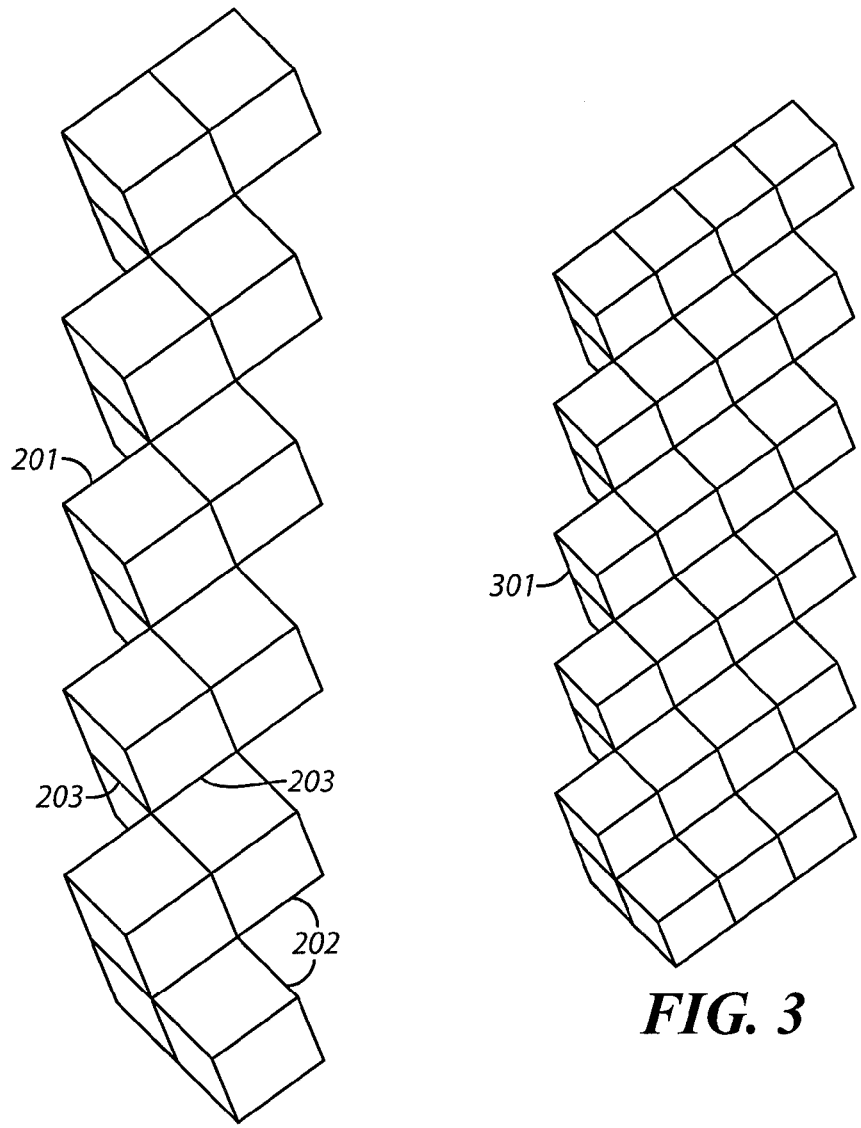
FIG. 2
FIG. 3

SELF-COMPOSITE COMPRISED OF NANOCRYSTALLINE DIAMOND AND A NON-DIAMOND COMPONENT USEFUL FOR THERMOELECTRIC APPLICATIONS

RELATED APPLICATIONS

This application claims the benefit of the filing date of U.S. Provisional Application 60/725,541 which is hereby incorporated in its entirety herein.

GOVERNMENT RIGHTS

This invention was made with Government support under Contract No. W-31-109-ENG-38 awarded by the United States Department of Energy. The Government has certain rights in this invention.

TECHNICAL FIELD

This invention relates generally to nanocrystalline diamonds.

BACKGROUND

The direct conversion of thermal energy into electrical energy (without the use of rotating machinery) is known in the art. This technology typically finds little practical application, however, as presently achievable conversion efficiencies are quite poor. For example, while such mechanisms as steam turbines are capable of conversion efficiencies in excess of about 50%, typical prior art direct conversion thermoelectric energy (TE) techniques offer only about 5 to 10% conversion efficiencies with even the best of techniques yielding no more than about 14% in this regard.

TE technologies generally seek to exploit the thermal energy of electrons and holes in a given TE material to facilitate the conversion of energy from heat to electricity. An expression to characterize the maximum efficiency for a TE power generator involves several terms including the important dimensionless figure of merit ZT. ZT is equal to the square of the Seebeck coefficient as multiplied by the electrical conductivity of the TE material and the absolute temperature, as then divided by the thermal conductivity of the TE material. With a ZT value of about 4, a corresponding TE device might be expected to exhibit a conversion efficiency approaching that of an ideal heat-based engine. Typical excellent state of the art TE materials (such as Bi2Te3-Bi2Se3 or Si—Ge alloys), however, have ZT values only near unity, thereby accounting at least in part for the relatively poor performance of such materials.

To reach a value such as 4 or higher, it appears to be necessary to maximize the power factor while simultaneously minimizing the thermal conductivity of the TE material (where the power factor can be represented as the product of the square of the Seebeck coefficient and the electrical conductivity). This has proven, however, a seemingly intractable challenge. This power factor and thermal conductivity are transport quantities that are determined, along with other factors, by the crystal and electronic structure of the TE material at issue. These properties are also impacted by the scattering and coupling of charge carriers with phonons. To maximize TE performance, these quantities seemingly need to be controlled separately from one another and this, unfortunately, has proven an extremely difficult challenge when working with conventional bulk materials.

Bulk diamond materials are also known in the art. As bulk diamond comprises both an outstanding thermal conductor and a superb electrical insulator, bulk diamond is quite unsuited for use as a TE material for at least the reasons set forth above. In more recent times, however, nanocrystalline diamond material (having crystallite sizes of about 2 to 5 nanometers) has been successfully doped to achieve n or p-type electrically conducting material at ambient temperatures of interest while also exhibiting very low thermal conductivity. These characteristics of nanocrystalline diamond material suggest its possible employment as a useful TE material. To date, however, no one has suggested a way to make good upon this possibility and hopes for a useful TE material continue to remain mere unmet aspirations.

BRIEF DESCRIPTION OF THE DRAWINGS

The above needs are at least partially met through provision of the an apparatus, method, and article of manufacture corresponding to a self-composite comprised of nanocrystalline diamond and a non-diamond component described in the following detailed description, particularly when studied in conjunction with the drawings, wherein:

FIG. 1 comprises a flow diagram as configured in accordance with various embodiments of the invention;

FIG. 2 comprises a schematic perspective view as configured in accordance with various embodiments of the invention;

FIG. 3 comprises a schematic perspective view as configured in accordance with various embodiments of the invention;

Figure 4:
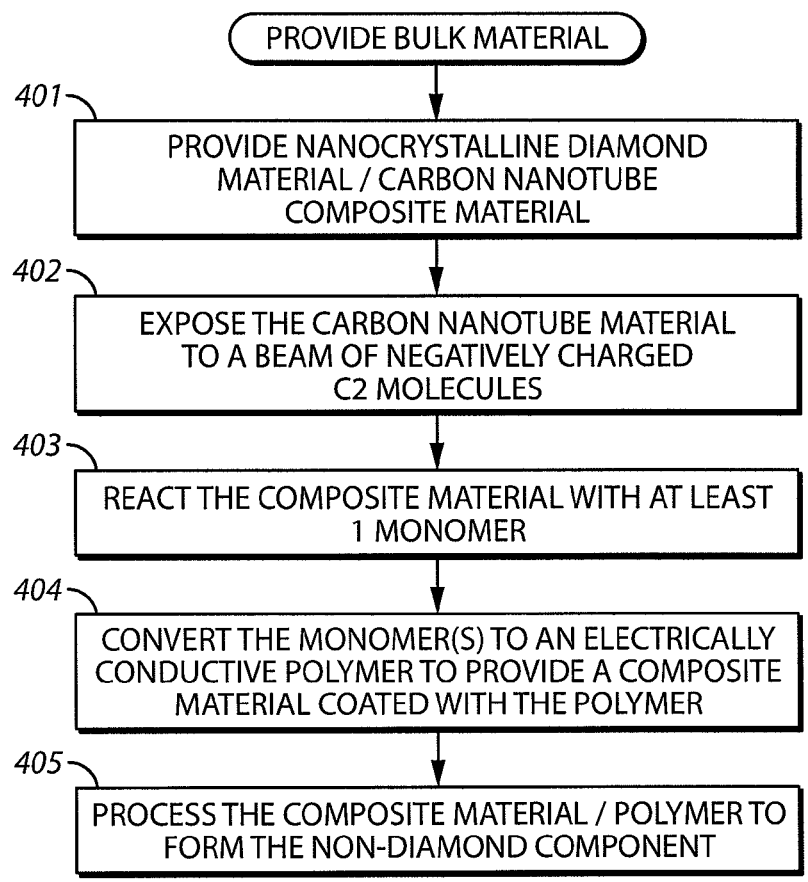
FIG. 4 comprises a flow diagram as configured in accordance with various embodiments of the invention.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION

Generally speaking, pursuant to these various embodiments, one provides nanocrystalline diamond material that comprises a plurality of substantially ordered diamond crystallites that are each sized no larger than about 10 nanometers. One then disposes a non-diamond component within the nanocrystalline diamond material. By one approach this non-diamond component comprises an electrical conductor that is formed at the grain boundaries that separate the diamond crystallites from one another. The resultant nanowire is then able to exhibit a desired increase with respect to its ability to conduct electricity while also preserving the thermal conductivity behavior of the nanocrystalline diamond material.

The nanocrystalline diamond material may comprise, for example, nanocrystalline diamond film, bulk nanocrystalline diamond material, and so forth. The non-diamond component can comprise, for example, one or more of disordered and defected carbon, defected graphite crystallites that are sized no larger than about 10 nanometers, and pristine or defected carbon nanotubes.

By one approach the nanocrystalline diamond material can be doped to achieve n or p-type deposits that further enhance a desired level of electrical conductivity. This doping can be inhomogeneously achieved if desired. It is also possible, if desired, to achieve inhomogeneous sp2/sp3 distributions as pertains to the nanocrystalline diamond and the non-diamond component.

So configured, these teachings appear able to yield appreciable quantities of a self-assembled, self-ordered material having properties well suited to TE power generation. It appears reasonable, for example, to expect such materials to exhibit a level of conversion efficiency that compares well against existing non-TE approaches. This, in turn, presents the possibility and hope of providing improved TE power generators not only in situations where TE generation is already used but as a substitute for existing rotating-machinery-based power generation.

These and other benefits may become clearer upon making a thorough review and study of the following detailed description. Referring now to the drawings, and in particular to FIG. 1, an illustrative corresponding process 100 begins with provision 101 of nanocrystalline diamond material comprising a plurality of substantially ordered (and preferably self-assembled) diamond crystallite particles each sized no larger than about 10 nanometers. This material might also comprise occasional larger-sized particles, of course, but should nevertheless be substantially if not exclusively comprised of particles of about 1 to 10 nanometers in size.

By one approach this nanocrystalline diamond material can comprise nanocrystalline diamond film. By another approach this nanocrystalline diamond material can comprise bulk nanocrystalline diamond material. Further description regarding both of these approaches will be provided further below.

This process 100 then provides for disposing 102 a non-diamond component within the nanocrystalline diamond material. By one approach this non-diamond component comprises at least one of disordered and defected carbon, defected graphite crystallites each sized no larger than about 10 nanometers, and/or at least singly-walled (or multi-walled) pristine or defected carbon nanotubes. There are various ways by which this step can be carried out as well and further details in this regard are also set forth further below.

By one approach these teachings can be employed to yield superlattice nanowires (having a width, for example, of no greater than about 40 nanometers and an aspect ration exceeding ten to one or even 100 to one) comprised of such materials. As will be illustrated below, each such nanowire can itself be comprised of nanocrystalline diamond that presents itself as helically arranged diamond nanocubes with the aforementioned non-diamond component being disposed between the grain boundaries of such diamond nanocubes.

As mentioned above, the nanocrystalline diamond can comprise a nanocrystalline diamond film. By one approach, the above-mentioned non-diamond component in the form of single-wall and/or multi-wall carbon nanotubes are conformally coated with n or p-type nanocrystalline diamond. As noted above, the formation of n or p-type nanocrystalline diamond is known in the art. By one approach, an Astex PDS 17 vapor deposition machine serves to generate a microwave plasma in a gas that comprises about 1% C60 or other hydrocarbon of interest (such as CH4) and 99% argon to which either nitrogen (for n-type doping) or trimethylboron (for p-type doping) has been added. A small amount of oxygen containing species can also be introduced, if desired, to aid with reducing soot formation.

To illustrate further, nanocrystalline diamond having n-type deposits can be prepared using a mixture of argon, nitrogen (about 20% by volume), and CH4. The nitrogen content in the synthesis gas produces highly aligned, oriented, and textured nanocrystalline diamond formations on the carbon nanotubes. Resultant electrical conductivity can be increased by using and controlling high temperature annealing in a vacuum furnace where the latter serves to graphitize the disordered carbon at the grain boundaries of the nanocrystalline diamond grains and to induce transformation of three layers of (111) nanocrystalline diamond into two (002) graphitic layers. Both graphitic layers result in the introduction of narrow electronic peaks near or at the Fermi level into the density of states. If desired, by establishing a temperature gradient in the vacuum furnace, inhomogeneous graphitization can be induced.

The useful orientation imposed on the nanocrystalline diamond by the nitrogen is due, it is believed, to changes in the alpha parameter (i.e., the ratio of growth velocities of different diamond crystal directions). Relatively high growth temperatures as employed pursuant to these teachings strongly enhance texture that results in a profound conformational transformation that may be characterized as a helix comprised of nanocrystalline diamond crystallites possessing a cubic habit. By increasing the growth temperature by about 300 degrees centigrade (as compared to a prior art value of about 800 degrees centigrade) the alpha parameter is decreased from a more typical value that is larger than unity to a value that is essentially equal to unity. This, in turn, tends to lead to a crystal habit that is a perfect cube which in turn facilitates the self-assembling self-ordering creation of the previously mentioned helix configuration.

Referring to FIG. 2, an exemplary illustrative nanowire 201 may comprise a single helix of diamond nanocubes 201 having the aforementioned non-diamond components at the grain boundaries 203 between such diamond nanocubes. Those skilled in the art will appreciate that the nanowire 201 depicted has a length that is shown arbitrarily short for the sake of illustrative clarity. In an actual embodiment this nanowire 201, though perhaps only 10 to 20 nanometers in width, can be hundreds (or even thousands) of nanometers in length. Those skilled in the art will further recognize and appreciate that such ordering is quite the opposite of the random orientation that one typically associates with prior art nanocrystalline diamond procedures and materials. It is believed that, at least in theory, this ordered construction should account for a 10× or better improvement with respect to electrical conductivity as compared to a non-ordered construction.

Those skilled in the art will further understand and appreciate that each diamond nanocube 202 comprises a lattice structure. Accordingly, when these nanocubes 202 self-order themselves in the ordered helical structure shown, the resultant ordered and arranged structure can properly be viewed as a superlattice nanowire.

With reference now to FIG. 3, it is also possible for these teachings to result in the self-assembly and self-ordering of diamond nanocubes as a double helix nanowire 301 where, again, non-diamond components such as disordered and defected carbon, defected graphite crystallites, and/or carbon nanotubes are disposed at the grain boundaries of these diamond nanocubes.

It is believed that post-growth relatively high temperature annealing further aids to bring about the above-described carbon structures and in particular a second helix of graphitic or otherwise conductive nanowires that are covalently bonded to the helix of nanocrystalline diamond material. Those skilled in the art will appreciate that a relatively wide range exists for the manipulation of electronic structures such as p-n junctions as both the nanocrystalline diamond and the non-diamond component helices can be separately and independently formed with n or p-type deposits. As both the helices and the nanotubes are covalently bonded to each other, efficient electron transport between these helices and nanotubes is easily facilitated.

A transition metal catalyst such as ferrocene or iron trichloride can be continuously added throughout the synthesis process. This so-called floating catalyst methodology aids with ensuring that simultaneous growth of the nanocrystalline diamond and of the carbon nanotubes occurs throughout the resultant thick film(s). The ratio of nanocrystalline diamond to carbon nanotubes can be at least partially controlled by adjusting the catalyst-to-carbon ratio. The latter may be accomplished, for example, by controlling the rate and/or quantity of catalyst introduced into the process.

By one approach, the Astex PDS 17 machine is modified to include a ferrocene transpiration apparatus comprising a tube having segmented, differentially heated zones that allow the establishment of a temperature gradient between the catalyst bed and the Astex PDS 17 reaction chamber. Adjustment of the temperature in this way produces locally useful ferrocene vapor pressures.

A small positive bias of a few volts can be applied to the substrate during growth to facilitate the extraction of negatively charged C2 species from the aforementioned plasma. Such components will react with the carbon nanotubes to effect alteration of the electronic structure of the latter. The magnitude of the bias can be controlled to thereby select for specific structural carbon nanotube alterations via this reaction.

By one approach n-type nanocrystalline diamond can be formed using N2/Ar/PH3/CH4 mixtures. This approach will place phosphorous in the nanocubes and also in the grain boundaries themselves with a given corresponding distribution ratio between these two points of reference. Phosphorus in the grain boundaries will tend to enhance the formation of pi-bonded carbon (much like nitrogen) and will also promote (111) texturing. In addition, p doping of the diamond nanocubes will occur primarily due to boron substitution for carbon in the diamond material.

The presence of phosphorous in the diamond nanocubes and in the grain boundaries will simultaneously provide two different mechanisms for enhancing the density of states at the Fermi level, thus increasing the Seebeck coefficient for this material. In particular, in the grain boundaries, pi-bonded disordered carbon due to the presence of the phosphorous gives rise to a new electronic state. In addition, substitutional phosphorous in the diamond nanocubes themselves introduces a doping level situated about 0.6 ev below the diamond conduction bands. This level introduces new electronic states and contributes to conductivity particularly at the higher temperatures envisioned for thermoelectric application of these materials.

By one approach p-type nanocrystalline diamond can be formed using AR/B2H6/CH4 or Ar/B2H6/CH4/N2 mixtures using plasma enhanced chemical vapor deposition techniques as are known in the art. Using this approach boron will be situated in both the diamond nanocubes and in the grain boundaries themselves. Concentrations between these two locations will again be determined by a corresponding distribution coefficient. When both N2 and B are present, compensation between n and p-type behavior in the grain boundaries will tend to occur. The behavior of B doped nanocrystalline diamond will be largely equivalent to that of p doped nanocrystalline diamond in that both will behave as semiconductors or semimetals depending on the concentration of the dopant.

Boron doping of nanocrystalline diamond introduces states near the Fermi level. As a result, the simultaneous presence of states near the Fermi level as introduced by defects in the carbon grain boundaries (or, for example, in graphitic nanowires when present) provides a powerful methodology for manipulating the states that control the magnitude of the Seebeck coefficient in ways not available by any other known materials system. Much the same occurs when considering the aforementioned n doped nanocrystalline diamond.

So configured, the electrically conducting but thermally insulating conformal coating of nanocrystalline diamond on the non-diamond component also presents high carrier concentrations of 10+19 to 10+20 per cubic centimeter. Being covalently bonded to, for example, a carbon nanotube-underpinning, the nanocrystalline diamond injects carriers into the carbon nanotubes which, upon reaching the end of a particular carbon nanotube, returns to the nanocrystalline diamond which then transports those carriers to the next carbon nanotube in the thick film deposit. An apt analogy might be a relay race being run by alternatively fast and slow runners with the baton comprising an electron that is moving through a thermal gradient as is imposed on this material.

As mentioned above, the nanocrystalline diamond material can also comprise bulk nanocrystalline material if desired. For example, ultradispersed diamond crystallites (as may be formed, for example, using detonation techniques) are commercially available in bulk form having particles sized from about 2 to 10 nanometers. More particularly, coupons are available that are comprised of ultradispersed diamond crystallites and single-wall or multi-wall carbon nanotubes.

With this in mind, and referring now to FIG. 4, a corresponding process 400 begins with providing 401 such a composite material and then exposing the carbon nanotubes to a mass and energy selected beam of negatively charged C2 molecules. This may comprise use, for example, of either photofragmentation or electron bombardment of C60 in order to produce the desired states at the Fermi level that are responsible for the desired high resultant Seebeck coefficients.

As a next step, this process 400 reacts 403 both the nanocrystalline diamond material and the carbon nanotubes in appropriate amounts with one or more monomers. Depending upon the monomer employed, the monomer will react with the composite material to produce n or p-type deposits. For example, when the monomer comprises an organic azide that attaches covalently at a nitrogen site n-type deposits will result. As another example, when the monomer comprises an organoboron monomer (in particular, an organoboron monomer that is capable of forming conducting functionalized polyacetylenes such as, but not limited to, mesitylborane, 9-borabicyclo[3.3.1]noane, and the like) that attaches at a boron site p-type deposits will result. By one approach, ultrasonic techniques are employed to facilitate coating substantially each nanocrystalline diamond and carbon nanotube with the monomer of choice.

This process 400 then provides for converting 404 the monomer(s) to an electrically conductive polymer such that the composite material is now substantially coated with the resultant polymer. Such polymerization can be achieved, for example, via pulsed plasma chemical methods or by use of other traditional catalyzed chemical reactions. By one approach, the resultant polymer comprises a functionalized polyacetylene.

As a next step one processes 405 the composite material and polymer coating to form the aforementioned non-diamond component. By one approach this comprises heating the composite/polymer material at high pressures to decompose the organic constituents and to induce incipient sintering. This procedure will lead to the formation of the previously described electrically conducting grain boundaries between the diamond crystallites that conformally coat the carbon nanotubes.

It would also be possible to initially provide a nanocrystalline diamond material that already includes n or p-type deposits. For example, boron or phosphorous can be added when forming such material using detonation techniques. A conducting compact is made by reacting the doped nanocrystalline diamond power with a C2 containing microwave plasma. The electrical conductivity can be further enhanced by partial graphitization of the compact at high temperatures.

As another approach, n or p-type nanocrystalline diamond can be prepared by mixing nanocrystalline diamond powder with nitrogen, boron, or phosphorous containing monomer molecules that are subsequently polymerized (with 5 to 10% of the total volume of the composite result being the resultant polymer). This polymer will act as a matrix to provide mechanical rigidity to a sheet that is then heated about 800 degrees centigrade while being exposed to a C2 containing microwave plasma. The C2 will react with the pyrolyzed polymer which in turn becomes a grain boundary bonding the nanocrystalline diamond particles into an n or p-type compact. Electrical conductivity can then be further enhanced by use of post plasma high temperature processing.

Figure 5:
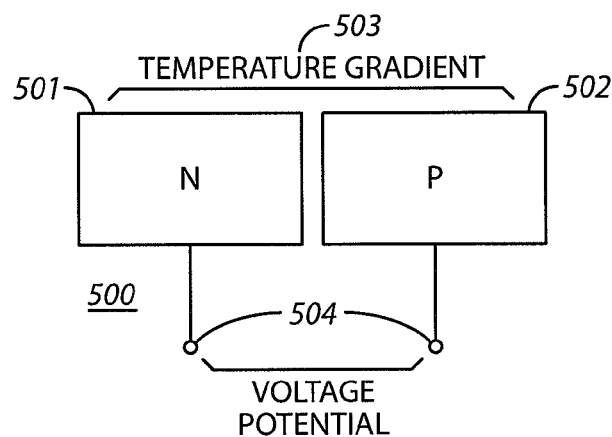
FIG. 5 comprises a block diagram as configured in accordance with various embodiments of the invention.

So configured, and referring now to FIG. 5, such material can be readily applied as a key TE component. To illustrate, an n-type block 501 of material and a p-type block 502 of material as described above, when subjected to a temperature gradient 503, will provide a voltage potential 504 (as electrons will seek to flow from the warmer area to the cooler area) at corresponding electrodes as shown to thereby provide an effective and efficient TE power generator 500.

In some cases these teachings may further accommodate post-synthesis processing that serves to establish inhomogeneous sp2/sp3 distributions of segmented nanocrystalline diamond/nanographitic nanowires. Such structures have been shown theoretically likely to provide conditions under which these nanomaterials can function as reversible thermoelectric materials and reach considerably improved figures of merit and conversion efficiency. This inhomogeneous sp2/sp3 distribution can be caused, for example, by imposing a temperature gradient as described above in the vacuum furnace.

Those skilled in the art will recognize that a wide variety of modifications, alterations, and combinations can be made with respect to the above described embodiments without departing from the spirit and scope of the invention, and that such modifications, alterations, and combinations are to be viewed as being within the ambit of the inventive concept. To illustrate, n and p-type nanocrystalline diamond can also be prepared by adding elements such as sulfur, lithium, aluminum, and so forth. Such dopants can substitute for carbon in volumetrically expanded grain boundaries (with those skilled in the art recognizing that such dopants will likely not be suitable substitutes in the diamond lattice itself). These possibilities exist in large part owing to the opportunity presented by the volumetrically expanded ubiquitous grain boundaries that tend to characterize at least certain of these teachings.

As another illustrative example in this regard, the above-described superlattice nanowires can be obtained separate from the substrate on which they are formed by dissolution of the substrate. These nanowires can be separated from the supernatant by filtration or centrifugation. The separated diamond nanowires can then be reacted with nanotubes to produce TE materials. Those skilled in the art will appreciate, however, that many other uses are also possible such as electron emitters for flat panel displays or for thermionics. In biological applications, after surface derivatization, biological molecules (such as, but not limited to, DNA, enzymes, and so forth) can be attached to the nano-diamond rods. These biologically active nano-diamond rods can then be injected, for example, into biological tissue for purposes of drug delivery, biological sensing, and so forth.

As yet one more illustrative example in this regard, nanocrystalline diamonds and carbon nanotube composites can be formed by thermal processing of appropriately functionalized dispersed nanocrystalline diamonds and carbon nanotubes such as (but not limited to) a mixture of hydrogen terminated dispersed nanocrystalline diamond and hydroxylated carbon nanotubes.

I claim:

1. A method comprising:
providing nanocrystalline carbon-containing sp3-bonded solid refractory material in the absence of a film and comprising a plurality of crystallites each sized no larger than about 10 nanometers;
forming covalent bonds between a non-diamond component and the nanocrystalline carbon-containing sp3-bonded solid refractory material wherein the non-diamond component comprises at least one of:
disordered carbon; and
graphite crystallites each sized no larger than about 10 nanometers.

2. The method of claim 1 wherein providing nanocrystalline carbon-containing sp3-bonded solid refractory material comprises providing bulk nanocrystalline carbon-containing sp3-bonded solid refractory material.

3. The method of claim 2 wherein forming covalent bonds comprises forming covalent bonds such that transport properties of both the plurality of crystallites and the non-diamond component are merged in a resultant material.

4. The method of claim 1 wherein forming covalent bonds comprises annealing the non-diamond component.

5. The method of claim 1 wherein the plurality of crystallites comprises a plurality of annealed crystallites.

6. The method of claim 1 wherein at least one of the nanocrystalline carbon-containing sp3-bonded solid refractory material and the non-diamond component is doped such that the material comprises at least one of a P type deposit and an N type deposit.

7. The method of claim 6 wherein the material is doped with at least one of boron, nitrogen, aluminum, and phosphorous.

8. The method of claim 1 wherein providing nanocrystalline carbon-containing sp3-bonded solid refractory material comprises providing nanocrystalline carbon-containing sp3-bonded solid refractory material that is inhomogenously doped such that the nanocrystalline carbon-containing sp3-bonded solid refractory material comprises an inhomogeneous distribution of at least one of a P type deposit and an N type deposit.

9. The method of claim 1 wherein forming the covalent bonds comprises forming a thermoelectrically active material.

10. The method of claim 9 further comprising:
using the thermoelectrically active material to generate electricity by subjecting the thermoelectrically active material to a temperature gradient to thereby provide a corresponding voltage potential.

* * * * *